United States Patent
Kuang et al.

(10) Patent No.: US 6,392,855 B1
(45) Date of Patent: May 21, 2002

(54) FLOATING BODY CHARGE MONITOR CIRCUIT FOR PARTIALLY DEPLETED SOI CMOS TECHNOLOGY

(75) Inventors: Jente Benedict Kuang, Lakeville, MN (US); Mary Joseph Saccamango, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 09/638,254

(22) Filed: Aug. 14, 2000

(51) Int. Cl.[7] ................................................. H02H 9/00
(52) U.S. Cl. ...................... 361/56; 361/91.1; 361/111; 361/118
(58) Field of Search .............................. 327/53, 57, 66; 257/347, 348, 351; 361/56, 91.1, 111, 118

(56) References Cited

U.S. PATENT DOCUMENTS 5,770,881 A * 6/1998 Pelella et al. ............... 257/347
6,078,058 A   6/2000 Hsu et al. .................... 257/347
6,151,200 A * 11/2000 Hsu et al. ...................... 361/56

* cited by examiner

*Primary Examiner*—Minh Loan Tran
(74) *Attorney, Agent, or Firm*—Joan Pennington

(57) ABSTRACT

Methods and apparatus are provided for monitoring excess body charges in partially depleted SOI CMOS devices. An apparatus for floating body charge monitoring in partially depleted silicon-on-insulator (SOI) CMOS circuits includes a monitor core circuit for conditionally generating an intentional bipolar discharge current. A current mirroring multiplier is coupled to the monitor core circuit for amplifying the intentional bipolar discharge current and generating a state disturb current. A state setting latch is coupled to the current mirroring multiplier for determining and setting a condition for a discharge action.

16 Claims, 9 Drawing Sheets

US 6,392,855 B1

FLOATING BODY CHARGE MONITOR CIRCUIT FOR PARTIALLY DEPLETED SOI CMOS TECHNOLOGY

FIELD OF THE INVENTION

The present invention relates to methods and apparatus for floating body charge monitoring in partially depleted silicon-on-insulator (SOI) complementary metal oxide semiconductor (CMOS) circuits.

DESCRIPTION OF THE RELATED ART

Silicon-on-insulator (SOI) technology is an enhanced silicon technology currently being utilized to increase the performance of digital logic circuits. By utilizing SOI technology, designers can increase the speed of digital logic integrated circuits or can reduce their overall power consumption. These advances in technology enable the development of more complex and faster integrated circuits that operate with less power.

A SOI transistor suffers from one inherent flaw. The floating body of the SOI transistor can develop a body charge over time. The amount of such floating body charge depends upon the potentials at the source, drain and gate of the SOI transistor. The maximum amount of charging occurs when the gate is completely turned off and both the source and drain electrodes are biased at the highest voltage supply Vdd. Given enough time and/or potential at the source and drain, the body charge of the SOI transistor will eventually reach a saturation level. If a switching activity occurs for that device, a transient parasitic bipolar current exists in conjunction with the normal device drain current. The transient parasitic bipolar current causes the well known first cycle performance degradation. In multiplexer style SOI circuit topologies, such timing behavior variation is particularly troublesome.

U.S. Pat. No. 6,078,058 issued Jun. 20, 2000 to Hsu et al. and assigned to the present assignee discloses an SOI floating body charge monitor circuit and method for discharging the body of a monitored SOI device through first and second discharge circuits. The second discharge circuit is selectively activated when the body potential of the monitored SOI device is at a level such that the body charge of the monitored SOI device cannot be discharged entirely through the first discharge circuit within normal operating cycle time allowances. The subject matter of the above-identified patent is incorporated herein by reference.

A need exists for an improved and effective mechanism for monitoring excess body charges in partially depleted SOI devices.

SUMMARY OF THE INVENTION

A principal object of the present invention is to provide an improved mechanism for monitoring excess body charges in partially depleted SOI CMOS devices. Other important objects of the present invention are to provide methods and apparatus for monitoring excess body charges in partially depleted SOI devices substantially without negative effect and that overcome many of the disadvantages of prior art arrangements.

In brief, methods and apparatus are provided for monitoring excess body charges in partially depleted SOI CMOS devices. Apparatus for floating body charge monitoring in partially depleted silicon-on-insulator (SOI) CMOS circuits includes a monitor core circuit for conditionally generating an intentional bipolar discharge current. A current mirroring multiplier is coupled to the monitor core circuit for amplifying the intentional bipolar discharge current and generating a state disturb current. A state setting latch is coupled to the current mirroring multiplier for determining and setting a condition for a discharge action.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
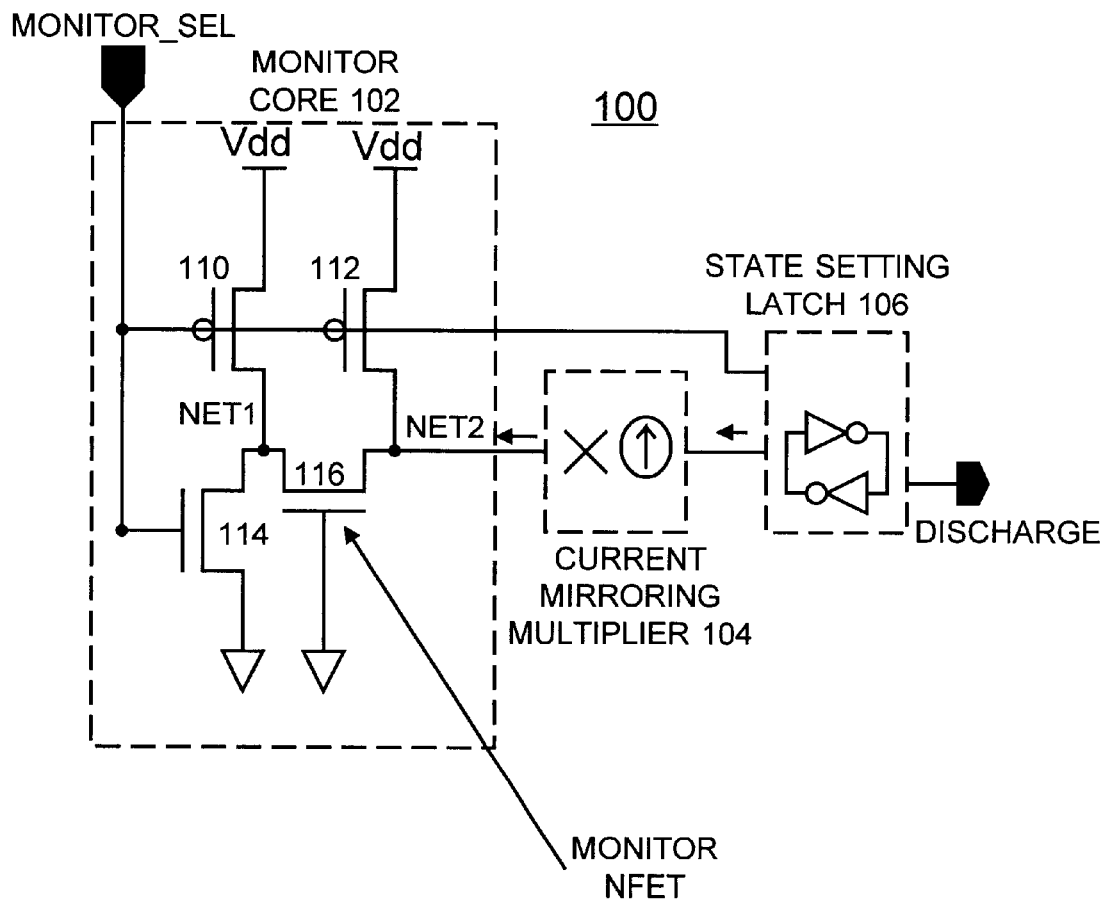
FIG. 1 is a schematic and block diagram representation illustrating a floating body charge monitoring circuit in partially depleted silicon-on-insulator (SOI) CMOS circuits of the preferred embodiment.

FIG. 1 illustrates a floating body charge monitoring circuit of the preferred embodiment generally designated by the reference character 100. Floating body charge monitoring circuit 100 includes a monitor core 102, a current mirroring multiplier 104 and a state setting latch 106.

In accordance with features of the invention, floating body charge monitoring circuit 100 of the preferred embodiment is arranged for monitoring excess body charges in partially depleted SOI devices. Floating body charge monitoring circuit 100 mimics the circuit configuration, device biasing, and history characteristics of the concerned circuit prone to the first cycle slowdown due to the existence of the parasitic bipolar current. When excess charges beyond tolerable limits are detected by the monitor core 102 of the floating body charge monitoring circuit 100, an automatic discharge path is enabled to provide more switching current. As a result, first cycle timing variation and speed degradation are effectively minimized.

Monitor core 102 is arranged for imitating an off state multiplexer topology with accompanying bias and select devices to conditionally generating an intentional bipolar discharge. Silicon-on-insulator (SOI) monitor core 102 includes a pair of SOI P-channel field effect transistors (PFETs) 110, 112 and a pair of SOI N-channel field effect transistors (NFETs) 114, 116. A monitor select (monitor_sel) input is applied to a respective gate of PFET 110, PFET 112 and NFET 114. NFET 116 is the monitor device. NFET 116 has its source connected to a node NET1, its drain connected to a node NET2 and its gate connected to ground. A body of SOI NFET 116 is charged at a potential that is representative of a body potential of a concerned SOI circuit.

A source of respective PFETs 110, 112 is connected to the high voltage supply Vdd. A drain of respective PFETs 110, 112 respectively is connected to node NET1 and node NET2. PFETs 110, 112 are precharge devices. NFET 114 has its drain connected to node NET1, and its source connected to ground. NFET 114 is a discharge trigger device. When the charge monitor core 102 is not selected when monitor select is low, the source and drain of NFET 116 at nodes NET1 and NET2 are precharged to the high voltage supply Vdd. When the charge monitor core 102 is selected when monitor select is high, the source of NFET 116 at node NET1 is brought to ground creating a bipolar current component which is input to the current mirroring multiplier 104.

Figure 2:
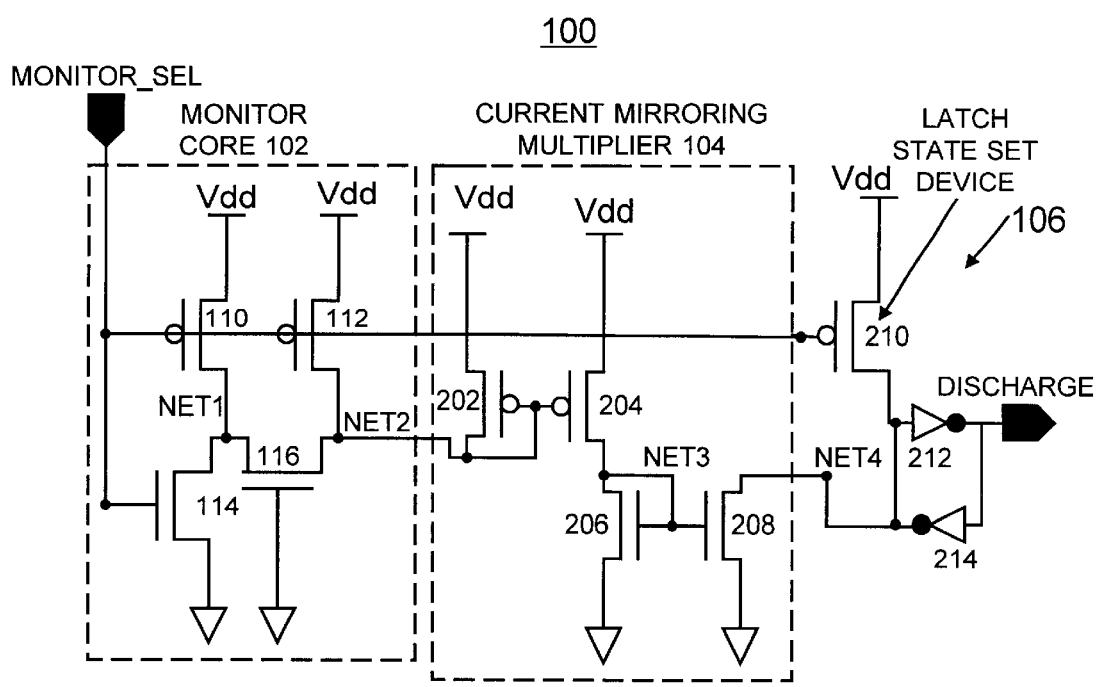
FIG. 2 is a schematic diagram representation illustrating the floating body charge monitoring circuit of FIG. 1 of the preferred embodiment.

Referring also to FIG. 2, the floating body charge monitoring circuit 100 of the preferred embodiment is shown in more detail. Current mirroring multiplier 104 is an arrangement of a current amplifier that is conditionally or selectively turned on. Current mirroring multiplier 104 includes two current mirror stages defined by a pair of P-channel field effect transistors (PFETs) 202, 204 and a pair of N-channel field effect transistors (NFETs) 206, 208 A source of respective PFETs 202, 204 is connected to the high voltage supply Vdd. A drain and gate of PFET 202 is connected to node NET2 and to a gate of PFET 204. A drain of PFET 204 is connected to a node NET3 and a gate and drain of NFET 206. A source of respective NFETs 206, 208 is connected to ground. A drain of NFET 208 is connected to the state setting latch 106 at a node NET4. Current mirroring multiplier 104 is off with node NET2 bias at Vdd when not being triggered.

State setting latch 106 is arranged for determining and setting the condition for discharge actions, which is selectively turned on depending directly on the output current of current mirroring multiplier 104, which in turn depends on the severity of body potential bias or the amount of accumulated body charges of the monitor NFET 116. State setting latch 106 includes a latch state set device, PFET 210 and a pair of series connect inverters 212, 214. A source of PFET 210 is connected to the high voltage supply Vdd. A drain of PFET 210 is connected to the input of inverter 212 at node NET4. A gate of PFET 210 is connected to the monitor select input. A common connection of the series connect inverters 212, 214 output of state setting latch 106 is labeled DISCHARGE. The output of inverter 214 is connected to node NET4.

In accordance with features of the invention, the current mirroring multiplier 104 of floating body charge monitoring circuit 100 of the preferred embodiment effectively translates a small intentional bipolar discharge current to a conditional flip of state in the discharge control latch 106 and enables tight control of design parameters for the charge monitor circuit 100. In current SOI technology, the parasitic bipolar current has decreased as compared to earlier SOI technology. Without the current mirroring multiplier 104, the available parasitic bipolar current is often too small to trigger a reliable state change for the state setting discharge control latch 106. Current mirroring multiplier 104 includes current gain factors, wp204/wp202, channel widths of PFETs 202, 204 and wn208/wn206, channel widths of NFETs 206, 208 enabling effective control of the switching threshold. When the charge monitor 102 is not triggered, the current mirroring multiplier 104 does not consume power because the gate to source bias for PFET 202 is zero. In turn, PFET 204, NFET 206 and NFET 208 are all in their off state. Due to the use of the current mirroring multiplier 104, the entire design of charge monitor circuit 100 can be very small in layout area, with small devices implementing the monitor device NFET 116, the precharge PFETs 110,112 and the discharge trigger NFET 114, without suffering timing loss, compromising signal quality, or sacrificing latch stability. With the current mirroring multiplier 104 and the path shut-off through PFET 210, the amplified NFET 208 drain current comes ahead of the originating bipolar current. In turn, this results in the timing advantage of a sharper discharge transition pulse edge.

Figure 3:
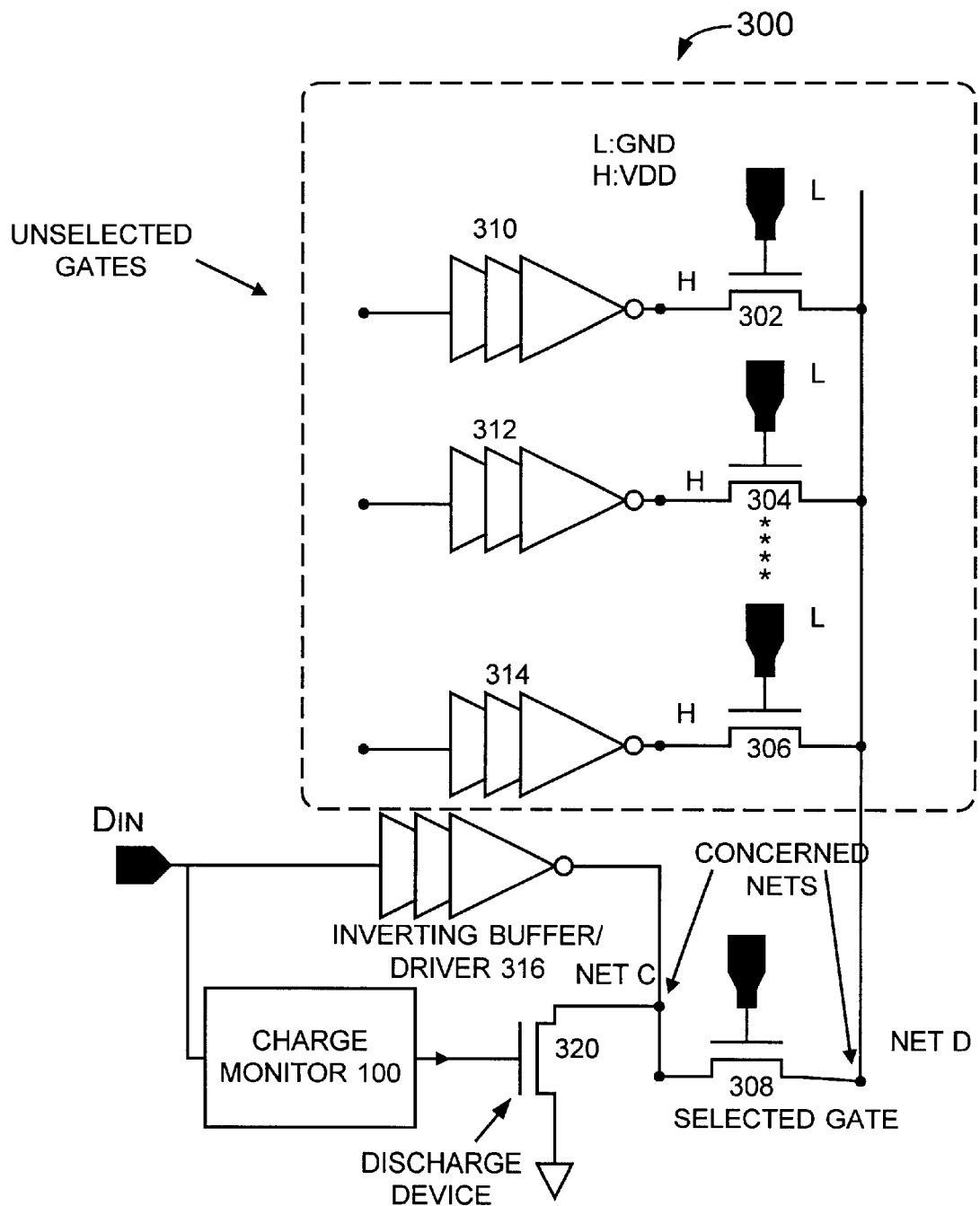
FIG. 3 is a schematic diagram representation illustrating an example multiplexer (MUX) circuit where the floating body charge monitoring circuit of FIG. 1 of the preferred embodiment can be used.

FIG. 3 is a schematic diagram representation illustrating an example multiplexer (MUX) circuit 300 where the floating body charge monitoring circuit 100 is used. MUX circuit 300 includes a stack of a plurality of SOI NFETs 302, 304, 306, 308 each having a drain connected to a node net D. A source of the respective SOI NFETs 302, 304, 306, 308 is connected to a respective inverting buffer/driver 310, 312, 314, 316. Each inverting buffer/driver 310, 312, 314, 316 includes a selected odd number of inverters, such as one, three, or five inverters. A source of a discharge NFET 320 is connected to the source of SOI NFET 316 at a node NET C. The drain of discharge NFET 320 is connected to ground. The gate of discharge NFET 320 is connected to the output of the charge monitor 100. An input data signal (Din) is used to trigger the monitor select input for the charge monitor 100. SOI NFETs 302, 304, 306 are unselected gates and SOI NFET 308 is the selected gate. A discharge device NFET 320 connects the charge monitor 100 to node NET C to control discharge, as shown. Alternatively, discharge device NFET 320 can connect the charge monitor 100 to node NET D to control discharge. There are timing difference and layout implication with respect to the choice between NET C and NET D. However, this choice does not change the merit or configuration of the charge monitoring circuit 100.

Figure 4A:
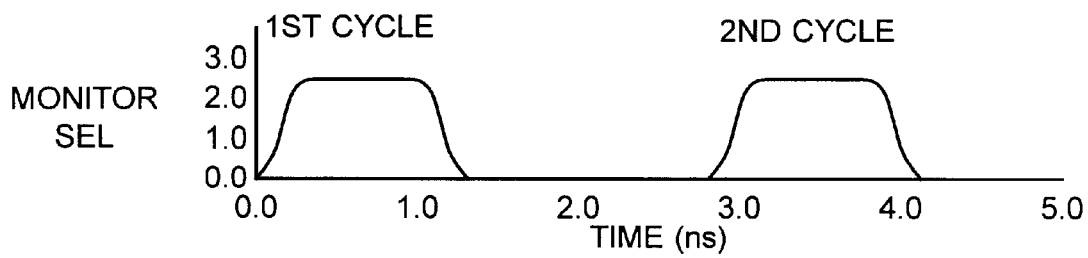
FIGS. 4A, 4B, 4C, 4D are charts illustrating voltage waveforms for the first two access cycles in the charge monitor core of the floating body charge monitoring circuit of FIG. 1 of the preferred embodiment.
Figure 4B:
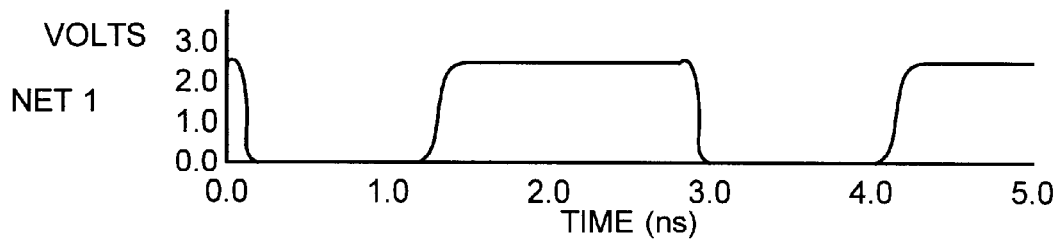
Figure 4C:
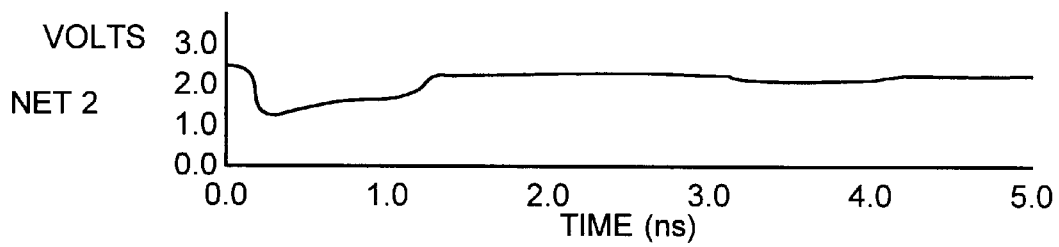
Figure 4D:
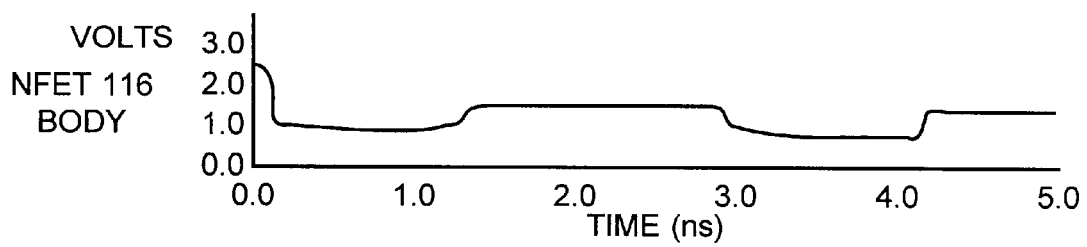

FIGS. 4A, 4B, 4C, 4D are charts illustrating voltage waveforms for the first two access cycles in the charge monitor core 102 of the floating body charge monitoring circuit 100 of the preferred embodiment. In FIG. 4A the monitor select signal is shown along the vertical axis relative to time shown along the horizontal axis. In FIG. 4B the voltage at node NET1 is shown along the vertical axis relative to time shown along the horizontal axis. The voltage at node NET1 is brought to ground when the monitor select signal is selected or high. The voltage at node NET1 is precharged to the high supply Vdd when the monitor select signal is not selected or low. In FIG. 4C the voltage at node NET2 is shown along the vertical axis relative to time shown along the horizontal axis. The voltage at node NET2 decreases when the monitor select signal is selected or high and is precharged to the high supply Vdd when the monitor select signal is not selected or low. During the first cycle, the more significant dips of NET2 voltage are the effect of the intentional bipolar discharge current. In FIG. 4D the body voltage of the monitor NFET 116 is shown along the vertical axis relative to time shown along the horizontal axis. The body voltage of the monitor NFET 116 decreases when the monitor select signal is selected or high and is charged to higher potential when the monitor select signal is not selected or low.

Figure 5:
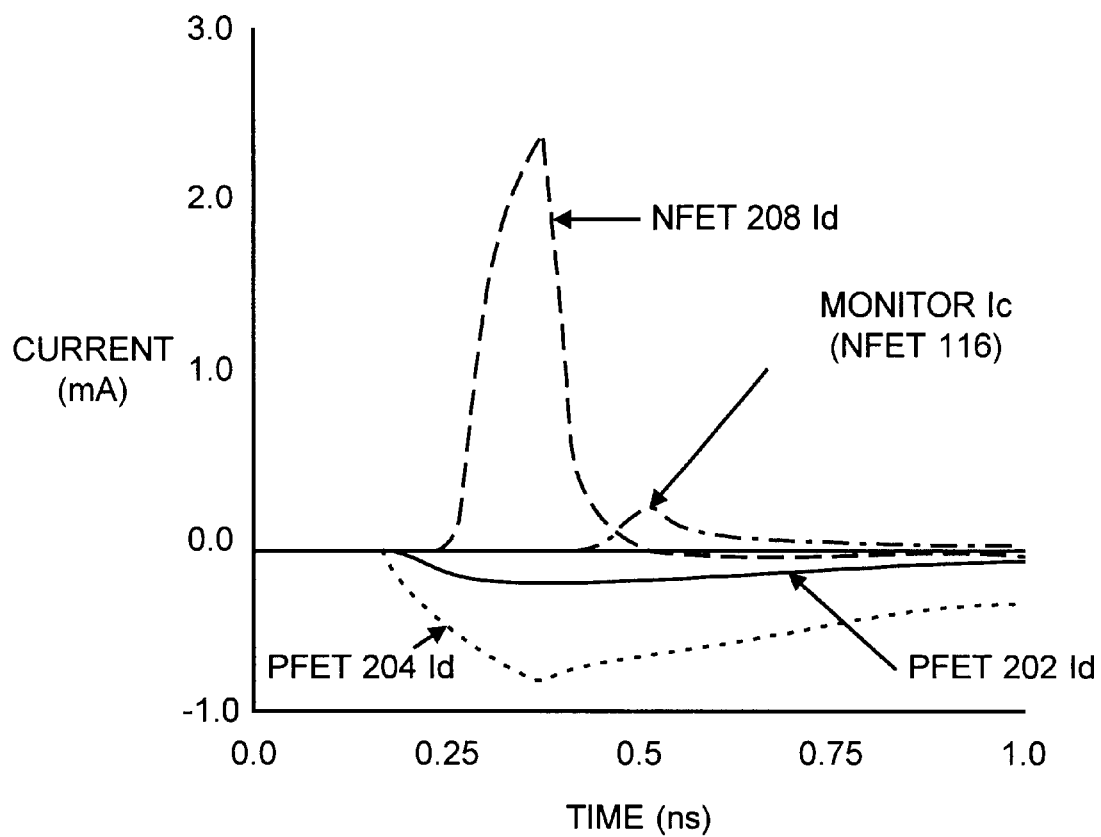
FIG. 5 is a chart illustrating current components for a charge monitoring bipolar transistor and current mirroring devices of the floating body charge monitoring circuit of FIGS. 1 and 2 of the preferred embodiment.

FIG. 5 is a chart illustrating current components for the charge monitoring transistor NFET 116 and current mirroring devices PFETs 202, 204 and NFET 208 of the floating body charge monitoring circuit 100 of the preferred embodiment. Current is shown along the vertical axis relative to time shown along the horizontal axis. The induced collector current Ic of monitor NFET 116 is injected into the current mirroring circuit 104, amplified by the two stages defined by PFETs 202, 204 and NFETs 206, 208, and injected to the state setting latch 106. The switching threshold of the state setting latch 106 is a design parameter. Variables contributing to the value of the switching threshold are the originating bipolar current magnitude, channel widths wp202, wp204, wn206, wn208 of the current mirroring devices PFETs 202, 204 and NFETs 206, 208 and the channel widths of PFET 112 and PFET 210. Considering the advantageous positioning of NFET 208 drain current Id against NFET 116 collector current Ic, the timing benefit can be identified even though there are two additional current amplifying stages. A peak current gain, NFET 208 Id versus NFET 116 Ic is approximately equal to k*(wn208/wn206)*(wp204/wp202); for example, where k~0.55 and *(wn208/wn206)=(wp204/wp202)=5.

Figure 6:
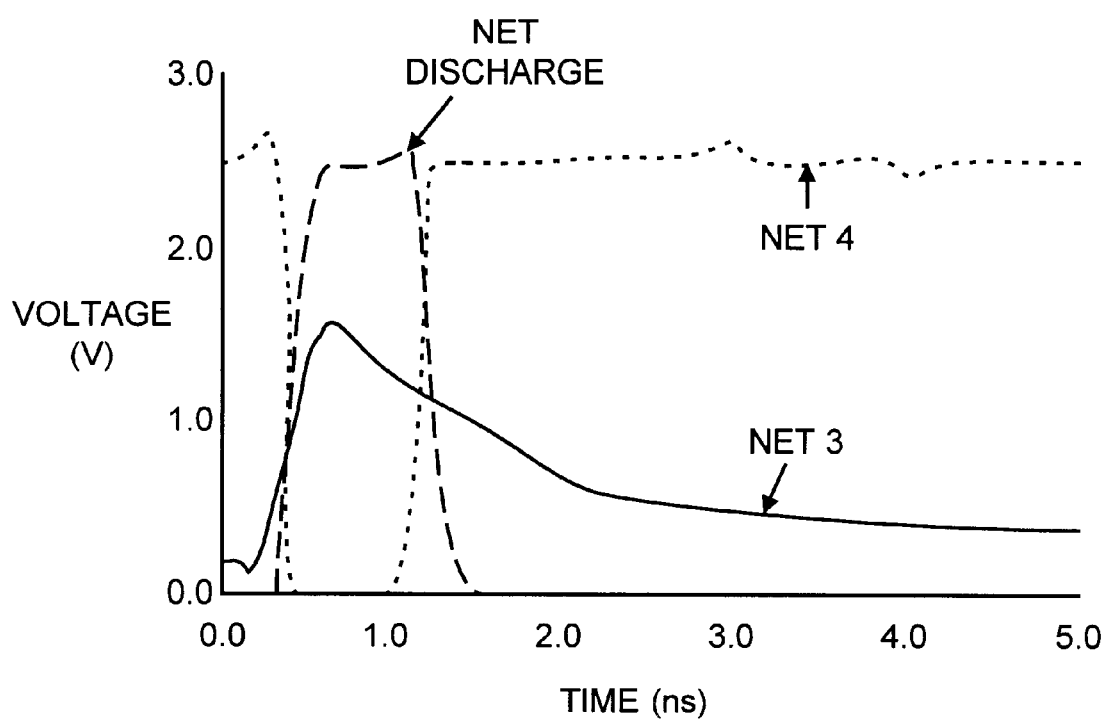
FIG. 6 is a chart illustrating voltage waveforms during the first two access cycles for the current mirror and latch circuit of the floating body charge monitoring circuit of FIGS. 1 and 2 of the preferred embodiment.

FIG. 6 is a chart illustrating voltage waveforms during the first two access cycles for the current mirror 104 and latch circuit 106 of the floating body charge monitoring circuit 100 of the preferred embodiment. In FIG. 6 voltage waveforms at nodes NET3, NET4 and DISCHARGE are shown along the vertical axis relative to time shown along the horizontal axis. Note that a clean latch output pulse at node DISCHARGE is generated as a result of transient currents at nodes NET3, NET4 in the first access cycle. During the second cycle, the monitoring circuit 100 does not produce a discharge output because the residual charges in the charge monitor 102 fall below the designated threshold.

Figure 7:
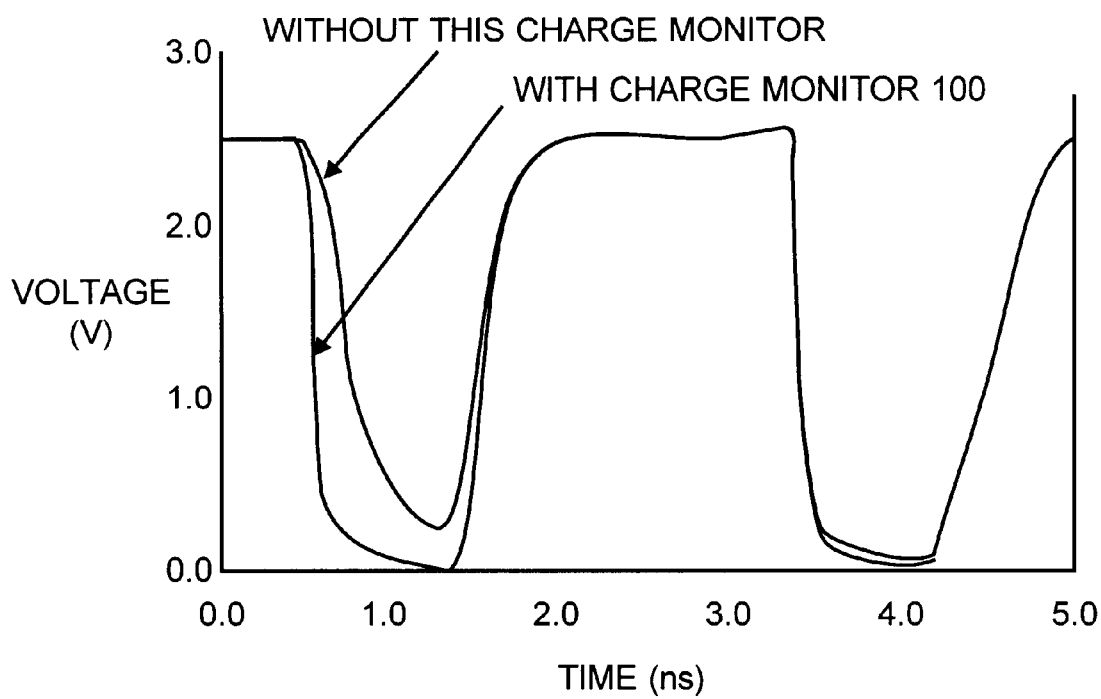
FIG. 7 is a chart illustrating a voltage waveform comparison observed at a concerned net in the example multiplexer (MUX) circuit of FIG. 3.

FIG. 7 is a chart illustrating a voltage waveform comparison observed at a concerned net D in the example multiplexer (MUX) circuit 300 of FIG. 3. At the concerned dotted MUX NET D, the waveform is shown with and without the charge monitoring circuit 100 of the preferred embodiment. In FIG. 7 voltage waveforms at node net D with and without the charge monitoring circuit 100 are shown along the vertical axis relative to time shown along the horizontal axis. The waveform is severely degraded during the first cycle if the charge monitoring circuit 100 is not used. If a 90% to 10% transition time is used as the criterion, performance loss for the unmodified circuit 300 is intolerable.

Figure 8:
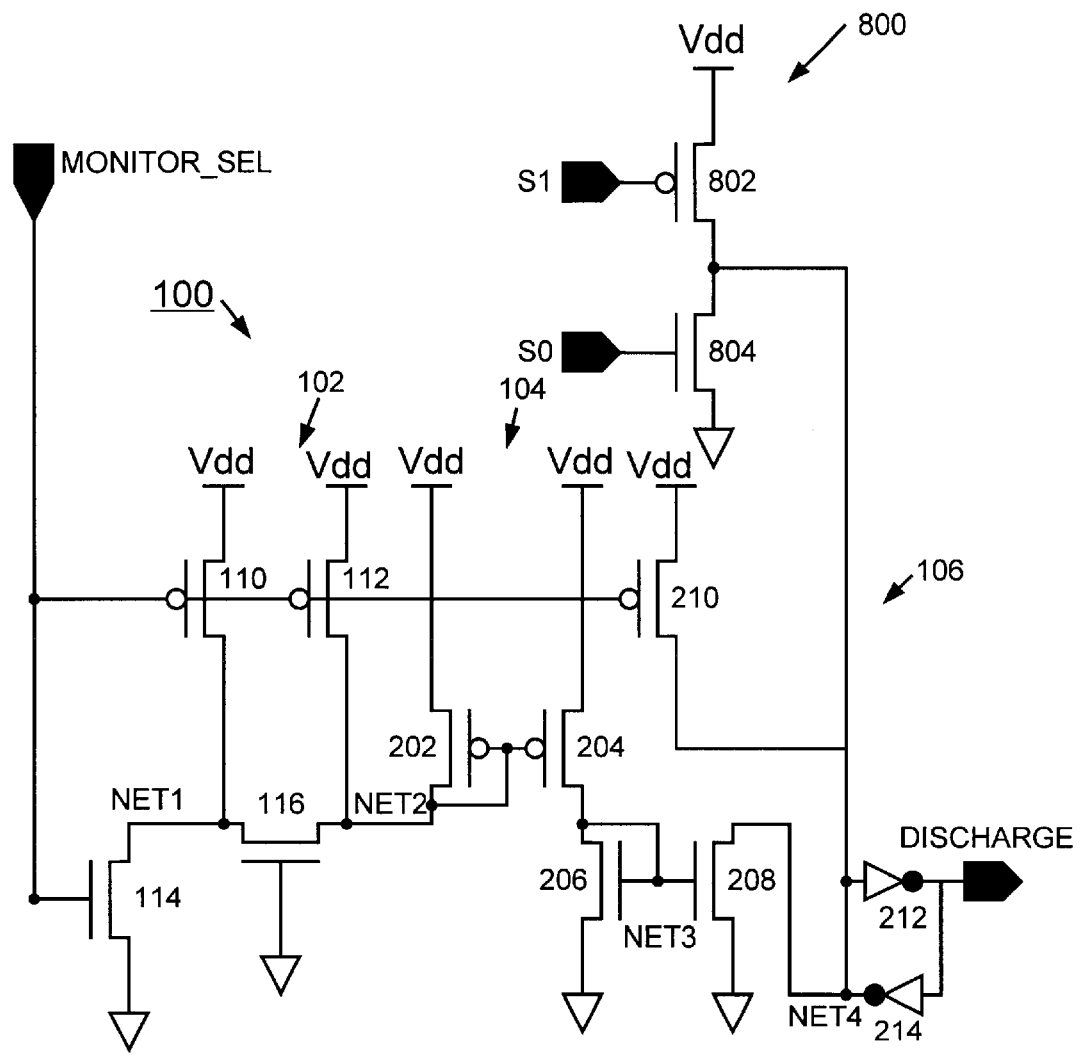
FIG. 8 is a schematic diagram representation illustrating a floating body charge monitoring circuit with a debug capability of the preferred embodiment.

In FIG. 8 there is shown the floating body charge monitoring circuit 100 with an enhanced debug capability of the preferred embodiment. As shown in FIG. 8, a state setting switch generally designated by the reference character 800 is added to the front end of the state setting latch 106. State setting switch 800 includes a PFET 802 and an NFET 804 connected in series between the high supply Vdd and ground. An input S1 is applied to the gate of PFET 802. An input S0 is applied to the gate of NFET 804. A common connection between PFET 802 and NFET 804 is connected to node NET4 at the input of inverter 212 and the output of inverter 214 of the state setting latch 106. When monitor select is equal to one, the following S0–S1 state table is used.

| S0–S1 state table | | |
|---|---|---|
| S0 | S1 | Functional Mode |
| 0 | 0 | Monitor Bypass |
| 0 | 1 | Monitor On |
| 1 | 0 | Forbidden State |
| 1 | 1 | Discharge On |

Figure 9:
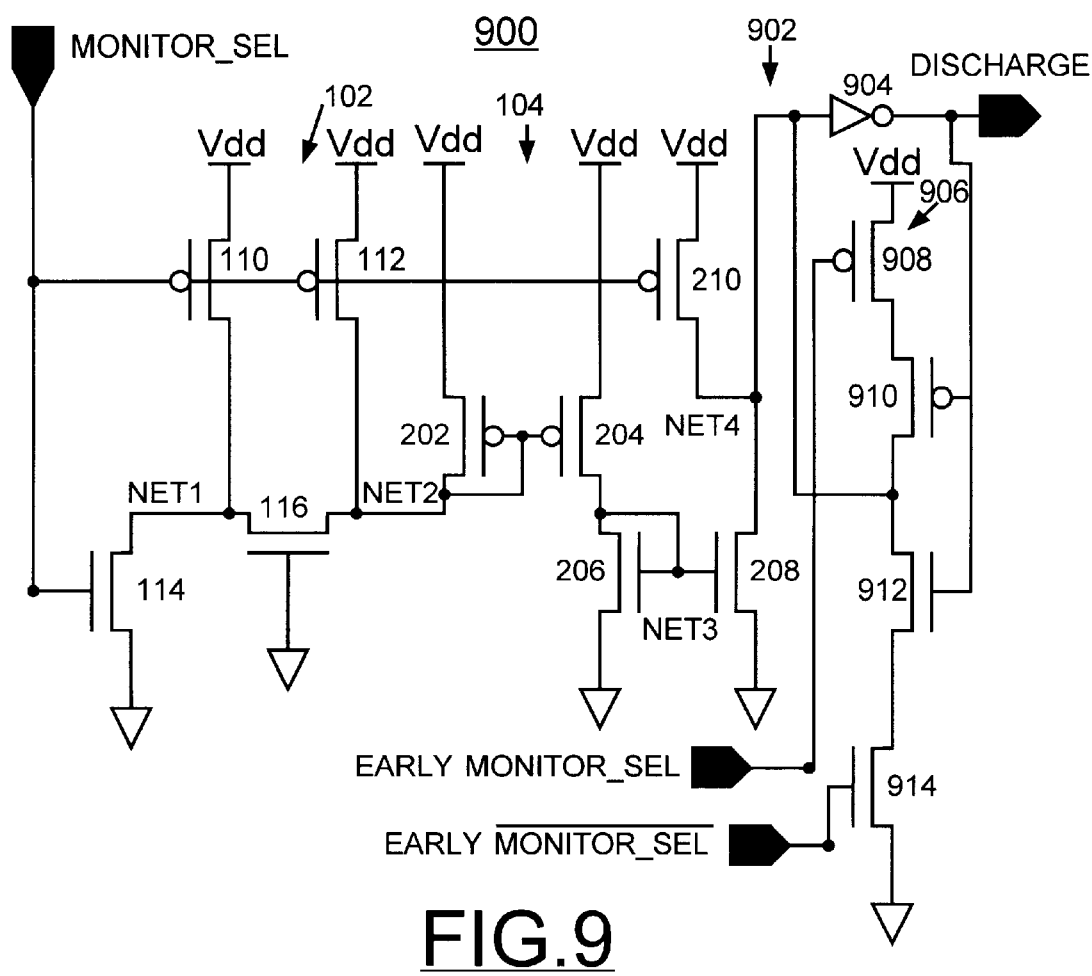
FIG. 9 is a schematic diagram representation illustrating a floating body charge monitoring circuit with an alternative latch topology of the preferred embodiment.

FIG. 9 is a schematic diagram representation illustrating a floating body charge monitoring circuit 900 with an alternative latch topology of the preferred embodiment. The floating body charge monitoring circuit 900 includes an identical monitor core 102 and current multiplier 104 as charge monitoring circuit 100. The floating body charge monitoring circuit 900 includes an alternative latch generally designated by the reference character 902. Latch 902 can be used when the complement of monitor select is available earlier than monitor select. Latch 902 includes the latch state set device PFET 210 and an inverter 904 connected between nodes NET4 and DISCHARGE. Latch 902 includes a transistor stack 906 connected between the high voltage supply Vdd and ground. Transistor stack 906 includes a pair of PFETs 908, 910 and a pair of NFETs 912, 914. A gate of PFET 914 is connected to the early complement of monitor select signal a gate of PFET 908 is connected to the early monitor select state. A common connection between PFET 910 and NFET 912 is connected to the input of inverter 904 at node NET4. A respective gate of PFET 910 and NFET 912 is connected to node DISCHARGE. Latch 902 can be provided to speed up the forward path in the monitoring circuit.

While the present invention has been described with reference to the details of the embodiments of the invention shown in the drawing, these details are not intended to limit the scope of the invention as claimed in the appended claims.

What is claimed is:

1. Apparatus for floating body charge monitoring in partially depleted silicon-on-insulator (SOI) CMOS circuits comprising:

a monitor core circuit for conditionally generating an intentional bipolar discharge current;

a current mirroring multiplier coupled to said monitor core circuit for amplifying said intentional bipolar discharge current and generating a state disturb current; and a state setting latch coupled to said current mirroring multiplier for determining and setting a condition for a discharge action.

2. Apparatus for floating body charge monitoring in partially depleted silicon-on-insulator (SOI) CMOS circuits as recited in claim 1 wherein said monitor core circuit includes a monitor silicon-on-insulator (SOI) device coupled to a pair of precharge devices; said precharge devices activated by a monitor select signal.

3. Apparatus for floating body charge monitoring in partially depleted silicon-on-insulator (SOI) CMOS circuits as recited in claim 2 wherein said monitor silicon-on-insulator (SOI) device includes an N-channel field effect transistor (NFET) and said pair of precharge devices include a pair of P-channel field effect transistors (PFETs); a first PFET coupled between a high voltage supply and a source of said monitor NFET and a second PFET coupled between a high voltage supply and a drain of said monitor NFET; and a gate of said monitor NFET connected to ground.

4. Apparatus for floating body charge monitoring in partially depleted silicon-on-insulator (SOI) CMOS circuits as recited in claim 3 wherein a discharge device is connected between said source of said monitor NFET and ground; said discharge device includes an N-channel field effect transistor (NFET).

5. Apparatus for floating body charge monitoring in partially depleted silicon-on-insulator (SOI) CMOS circuits as recited in claim 1 wherein said current mirroring multiplier coupled to said monitor core circuit for generating said state disturb current includes a pair of current mirror stages.

6. Apparatus for floating body charge monitoring in partially depleted silicon-on-insulator (SOI) CMOS circuits as recited in claim 5 wherein said pair of current mirror stages include a pair of P-channel field effect transistors (PFETs) and a pair of N-channel field effect transistors (NFETs).

7. Apparatus for floating body charge monitoring in partially depleted silicon-on-insulator (SOI) CMOS circuits as recited in claim 6 wherein said current mirroring multiplier has a current gain proportional to channel widths of said pair of P-channel field effect transistors (PFETs) and said pair of N-channel field effect transistors (NFETs).

8. Apparatus for floating body charge monitoring in partially depleted silicon-on-insulator (SOI) CMOS circuits as recited in claim 1 wherein said monitor core circuit for conditionally generating said intentional bipolar discharge current is activated by a monitor select signal.

9. Apparatus for floating body charge monitoring in partially depleted silicon-on-insulator (SOI) CMOS circuits as recited in claim 8 wherein said current mirroring multiplier coupled to said monitor core circuit for generating said state disturb current is activated responsive to said activated monitor core circuit.

10. Apparatus for floating body charge monitoring in partially depleted silicon-on-insulator (SOI) CMOS circuits as recited in claim 1 wherein said current mirroring multiplier is off when said monitor core circuit is not activated.

11. Apparatus for floating body charge monitoring in partially depleted silicon-on-insulator (SOI) CMOS circuits as recited in claim 1 wherein said state setting latch includes an inverter coupled to said current mirroring multiplier.

12. Apparatus for floating body charge monitoring in partially depleted silicon-on-insulator (SOI) CMOS circuits as recited in claim 11 wherein said latch includes a precharge device coupled between a high voltage supply and an input to said inverter coupled to said current mirroring multiplier.

13. Apparatus for floating body charge monitoring in partially depleted silicon-on-insulator (SOI) CMOS circuits as recited in claim 12 wherein said precharge device includes a P-channel field effect transistor (PFET) having a gate input receiving a monitor select signal.

14. A method for floating body charge monitoring in partially depleted silicon-on-insulator (SOI) CMOS circuits utilizing a charge monitoring circuit including a monitor core circuit, a current mirroring multiplier and a latch comprising the steps of:

providing a monitor select signal to said monitor core circuit for conditionally generating an intentional bipolar discharge current;

utilizing said current mirroring multiplier coupled to said monitor core circuit for amplifying said intentional bipolar discharge current and generating a state disturb current; and utilizing said state setting latch coupled to said current mirroring multiplier for determining and setting a condition for a discharge action.

15. A method for floating body charge monitoring in partially depleted silicon-on-insulator (SOI) CMOS circuits as recited in claim 14 includes the steps of utilizing a plurality of transistors to form said current mirroring multiplier; and determining a current gain of said current mirroring multiplier by selecting current widths of said plurality of transistors.

16. A method for floating body charge monitoring in partially depleted silicon-on-insulator (SOI) CMOS circuits as recited in claim 14 includes the steps of deactivating said current mirroring multiplier when said monitor core circuit is deactivated.

* * * * *